(12) United States Patent
Ross

(10) Patent No.: US 6,310,519 B1
(45) Date of Patent: Oct. 30, 2001

(54) METHOD AND APPARATUS FOR AMPLIFIER OUTPUT BIASING FOR IMPROVED OVERALL TEMPERATURE STABILITY

(75) Inventor: Robert Ross, Raleigh, NC (US)

(73) Assignee: Mitsubishi Electric & Electronics U.S.A., Inc., DE (US)

( * ) Notice: Subject to any disclaimer, the term of this patent is extended or adjusted under 35 U.S.C. 154(b) by 0 days.

(21) Appl. No.: 09/589,118

(22) Filed: Jun. 8, 2000

(51) Int. Cl.[7] .................................................. H03F 3/04
(52) U.S. Cl. ..................................... 330/289; 330/256
(58) Field of Search ................................ 330/256, 289

(56) References Cited

U.S. PATENT DOCUMENTS

| | | | |
|---|---|---|---|
| 5,172,017 | 12/1992 | Schmidt | 307/494 |
| 5,200,654 * | 4/1993 | Archer | 330/256 |
| 5,436,594 | 7/1995 | Pace et al. | 330/258 |
| 5,798,660 | 8/1998 | Cheng | 330/311 |
| 5,912,589 * | 6/1999 | Khoury et al. | 330/256 |
| 6,020,786 * | 2/2000 | Ashby | 330/356 |

FOREIGN PATENT DOCUMENTS

| | | | |
|---|---|---|---|
| 522254 * | 1/1977 | (JP) | 330/256 |

* cited by examiner

Primary Examiner—Michael B Shingleton
(74) Attorney, Agent, or Firm—Burns, Doane, Swecker & Mathis, L.L.P.

(57) ABSTRACT

An amplifier output is biased to optimize performance characteristics such as gain and output voltage. A temperature-independent current is subtracted from a temperature-dependent current. The difference is injected at the amplifier output to bias the amplifier output such that performance characteristics are enhanced. An additional amplifier stage may be used to prevent the bandwidth performance of the amplifier from being affected by the current injection.

16 Claims, 5 Drawing Sheets

METHOD AND APPARATUS FOR AMPLIFIER OUTPUT BIASING FOR IMPROVED OVERALL TEMPERATURE STABILITY

BACKGROUND

This invention relates generally to a method and apparatus for amplifier biasing. More specifically, this invention relates to a method and apparatus for optimizing the temperature dependence of various performance parameters of an amplifier.

The design of a typical bipolar amplifier requires trade-offs between a number of characteristics, such as noise voltage, gain, and output quiescent voltage over a range of various environmental and process conditions. Typically, designs which require low noise must use an undegenerated common-emitter amplifier (or differential pair for differential designs) with resistive loading. An example of such an amplifier is shown in FIG. 1 which depicts an amplifier stage 100 including a transistor QI fed at the base by a voltage VIN and connected at the collector to a supply voltage VCC, via a resistor R. Connected to the emitter of the transistor is a current source IEE. The output voltage is given as VOUT=VCC−ICC*R, and the gain is roughly given by AV=IEE*R/VT, where VT=kT/q, and k is Boltzmann's constant, T is temperature, and q is the electron charge. Ignoring the temperature dependence of R, dAV/dT is proportional to dIEE/dT−dT/dT, and dVOUT/dT is proportional to dICC/dT. Therefore, in order to minimize the variation of the gain AV and the output voltage VOUT over temperature, IEE must be proportional to temperature, while ICC must be constant.

Typically, this is not possible due to the fact that ICC=IEE (ignoring base current errors). Thus, a designer is typically forced to choose to maintain either constant gain AV or constant output voltage VOUT over temperature by appropriately defining the temperature dependence of IEE. A proportional-to-absolute-temperature (PTAT) current reference can be used to define IEE and ICC to maintain a constant gain AV over temperature, or a bandgap (BGAP) current reference can be used to define ICC and IEE to maintain a constant output voltage VOUT over temperature.

There have been various attempts to optimize performance characteristics of amplifiers. Some of these attempts have been directed at optimizing the gain by injecting a current at the amplifier output. For example, U.S. Pat. No. 5,798,660 describes how the gain of a CMOS differential amplifier stage may be enhanced by the injection of additional current at the drains of the differential pair. U.S. Pat. No. 5,436,594 describes a current source that biases a differential amplifier to control the gain of the amplifier.

None of these past attempts have independently optimized the temperature dependency of multiple parameters, such as gain and output voltage.

There is thus a need for a technique for amplifier output biasing that simultaneously minimizes temperature variations of various performance parameters.

SUMMARY

It is therefore an object of the present invention to simultaneously optimize the temperature dependence of various performance parameters.

According to an exemplary embodiment, this and other objects are met by a method and apparatus for amplifier output biasing. A temperature-dependent current is generated, and a temperature-independent current is generated. The temperature-independent current is subtracted from the temperature-dependent current. The difference is injected at the amplifier output to optimize the temperature dependence of performance characteristics such as gain and output voltage. The amplifier may be a differential amplifier. An additional amplifier stage may be used to prevent the current injection from affecting the bandwidth performance of the amplifier.

BRIEF DESCRIPTION OF THE DRAWINGS

The features, objects, and advantages of the invention will become apparent by reading this description in conjunction with the accompanying drawings, in which like reference numerals refer to like elements and in which.

DETAILED DESCRIPTION

According to exemplary embodiments, a method and apparatus are provided for amplifier output biasing. Different performance characteristics can be optimized by generating a temperature-dependent current and a temperature-independent current and injecting the difference between these currents at the amplifier output.

Figure 1:
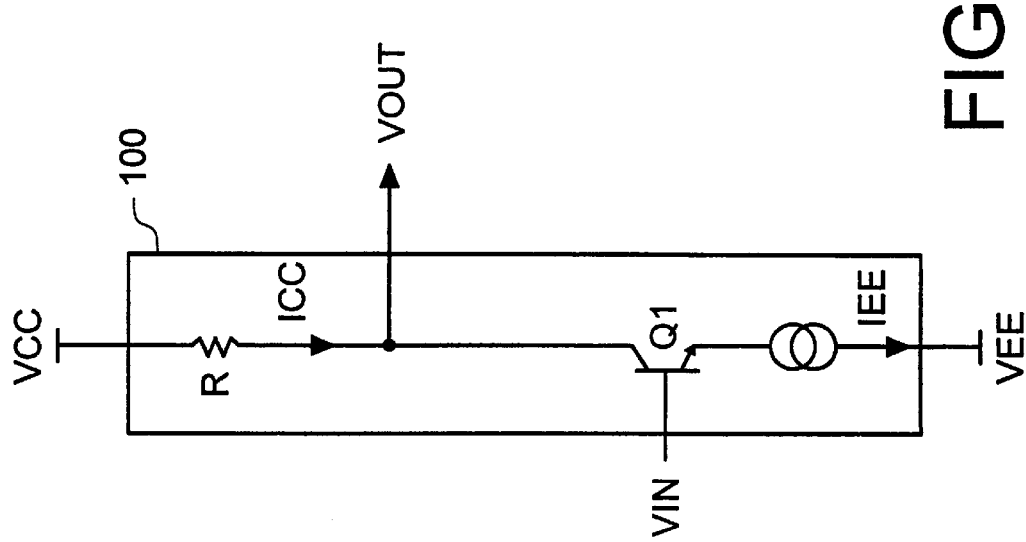
FIG. 1 illustrates a conventional apparatus for amplifier output biasing.
Figure 2A:
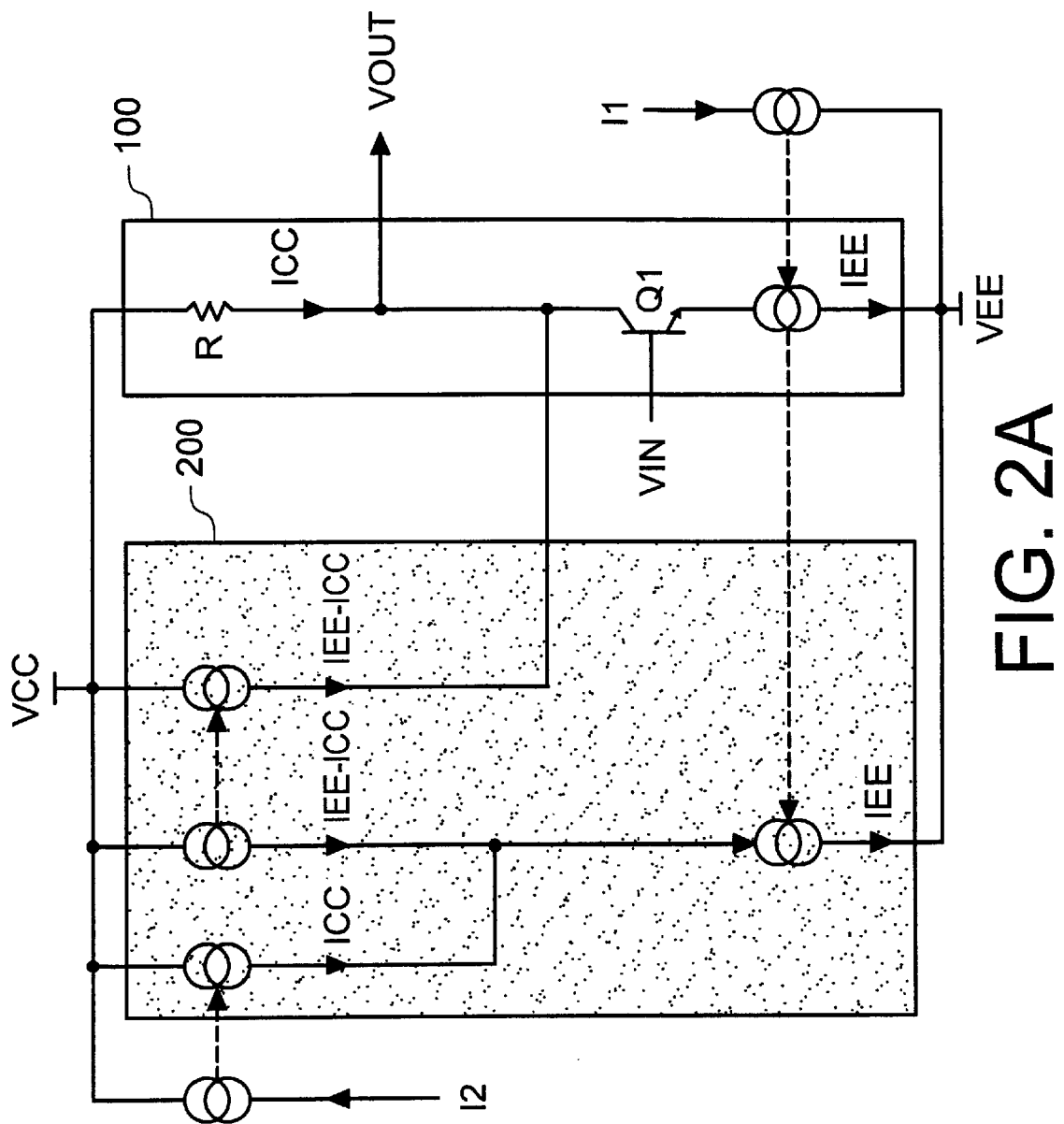
FIG. 2A illustrates an apparatus for amplifier output biasing according to an exemplary embodiment.

FIG. 2A illustrates an apparatus for biasing an amplifier output according to an exemplary embodiment. The device 200 ensures that both the gain AV and the output voltage VOUT remain stable over temperature variations. The bias currents IEE and ICC are independently optimized through the use of current subtraction. A first current source I1 is used to define IEE, while a second current source I2 defines ICC. A first current generator I1 generates a current that is temperature-dependent, e.g., a current that is proportional to absolute temperature (IPTAT), and a second current generator I2 generates a current that is fairly constant and temperature-independent, e.g., a band gap current (IBGAP). These currents may be generated, e.g., by bias current generators. Although shown separately, the current sources I1 and I2 may be included in the device 200.

As shown in FIG. 2A, a first current mirror mirrors the current for IEE that is temperature-dependent, to cancel out the VT term in the gain equation. A second current mirror mirrors the current IEE again. A third current mirror mirrors the current I2 and generates a current for ICC that has a negligible temperature dependence. A fourth current mirror has its input connected to the output of the second current source I2 and has its output connected to the output of the second current mirror and the third current mirror. The output of the fourth current mirror is thus proportional to the quantity IEE−ICC. This current is mirrored by a fifth current mirror, the output of which is connected to the amplifier output node, e.g., the collector. Since the amplifier emitter current is defined as IEE, this forces the resistive load current to be equal to IEE−(IEE−ICC)=ICC. Thus, the injection of the current into the amplifier produces an output bias current that is not current dependent, so that the output voltage VOUT is independent of temperature.

While it has been assumed that R is constant over temperature, if R varies with temperature, this can be taken into account in the IEE and ICC current references, such that the current and resistor temperature dependencies cancel out. The process variation of the gain and voltage output can be minimized by using the same type of resistor for R as used in the IEE and ICC reference circuits.

Figure 2B:
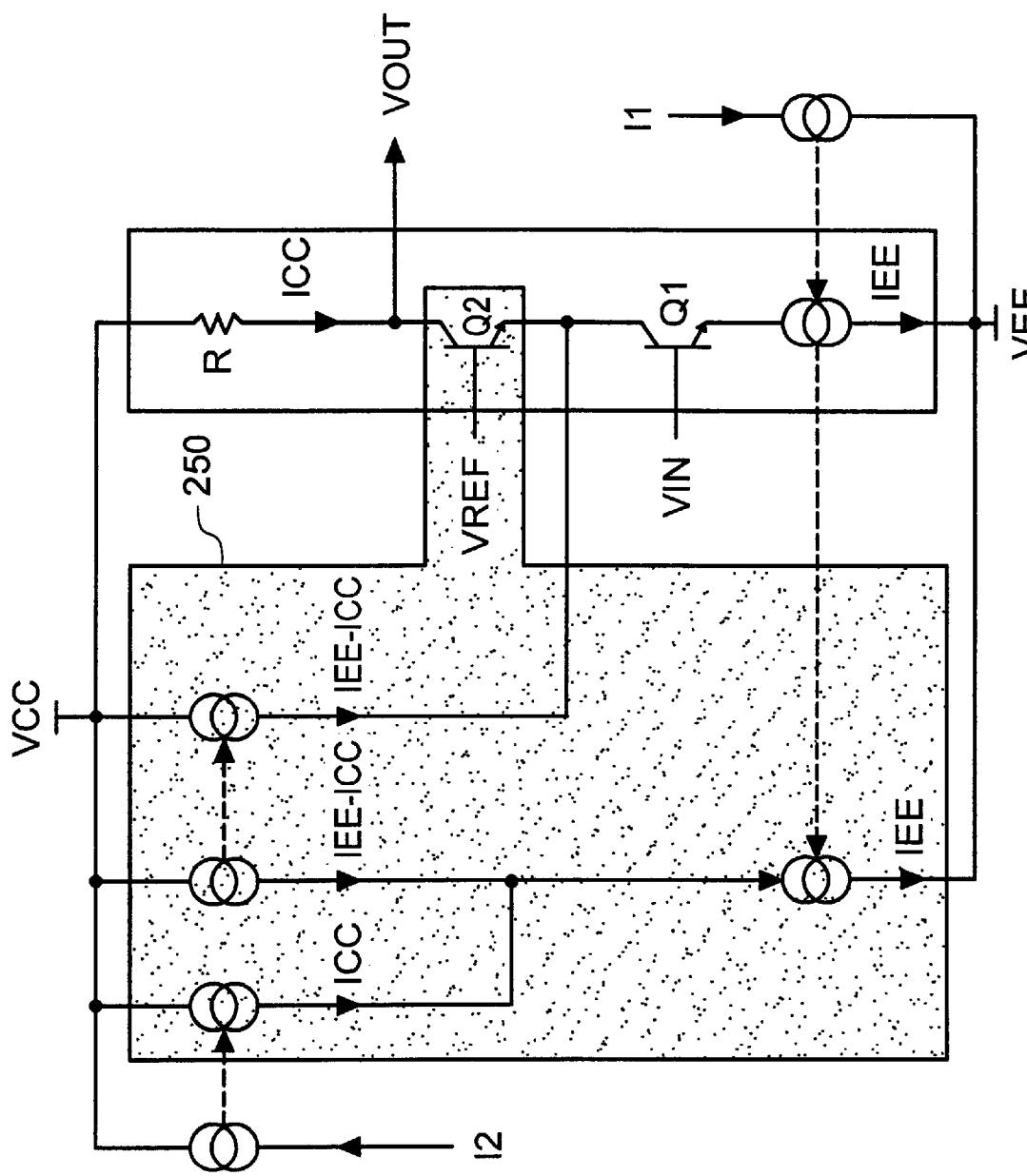
FIG. 2B illustrates an apparatus for amplifier biasing including an additional stage according to an exemplary embodiment.

According to an exemplary embodiment, an additional amplifier stage may be used to prevent the bandwidth of the amplifier from being affected by the load of IEE–ICC. For example, a common base stage may be added to form a cascode configuration, as shown in FIG. 2B. The common base stage shown includes a transistor Q2 with a base connected to a voltage reference VREF, an emitter connected to the collector of Q1, and a collector connected to the resistor R at the amplifier output. The common base stage isolates the injected current from the output, so that adding the current injection load does not affect the bandwidth performance of the amplifier.

Figure 2C:
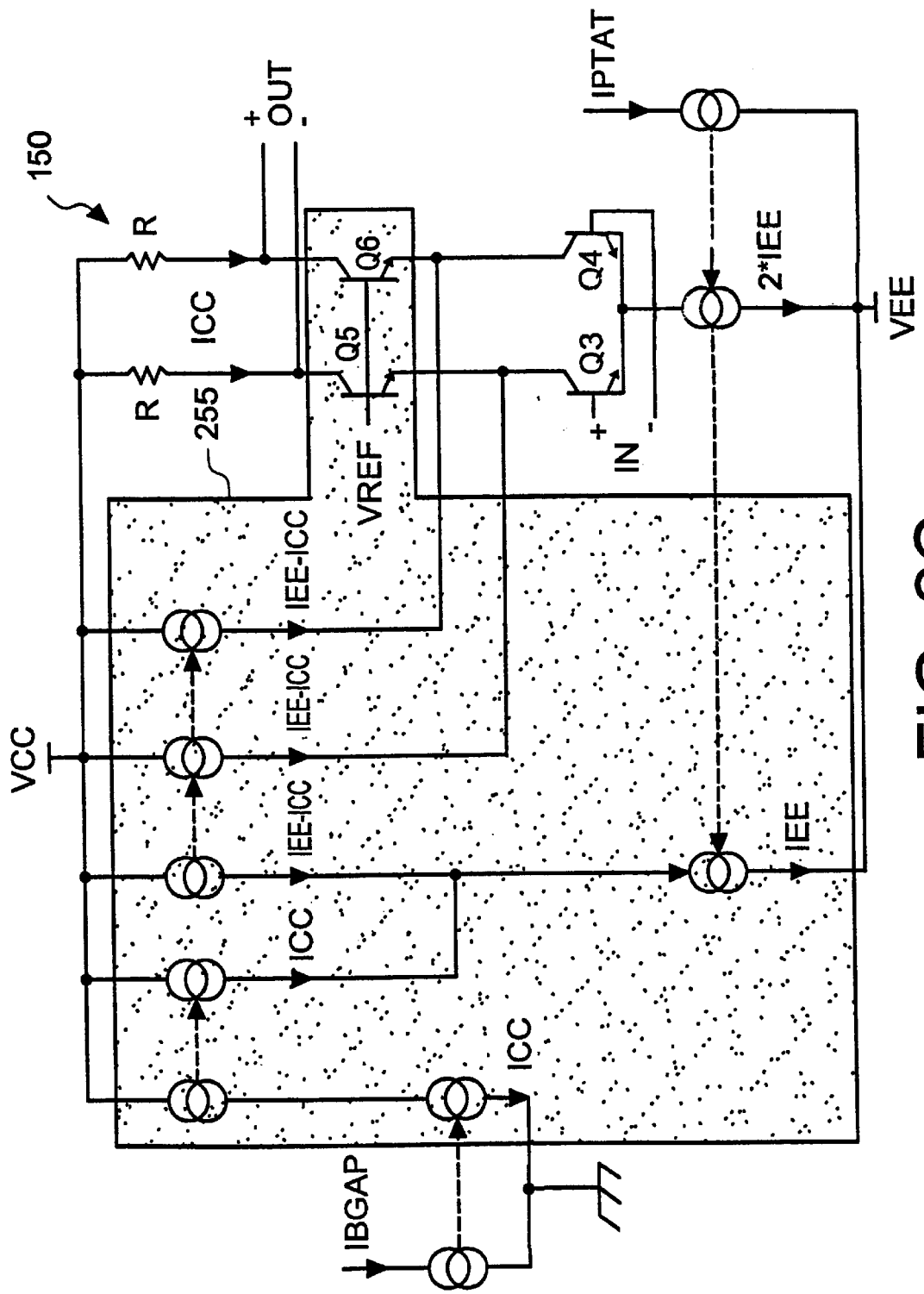
FIG. 2C illustrates an apparatus for biasing a differential amplifier output according to an exemplary embodiment.

The apparatus for biasing an amplifier output may be used for biasing a differential amplifier, as shown in FIG. 2C. In FIG. 2C, a device 255 insures that both the gain and the output voltage remain stable over temperature variations. By way of example, the device shown in FIG. 2C, includes a temperature-dependent current source, e.g., a proportional-to-absolute-temperature current source Iptat, that is mirrored by a first current mirror to generate a current 2*Iee in order to cancel out the effect of the VT term in the gain equation. A second current mirror generates a current Iee. A temperature-independent current source, e.g., a bandgap reference current source Ibgap, is mirrored by a third current mirror, and again, by a fourth current mirror to produce a current Icc which has negligible temperature dependence. A third current mirror generates a current Iee. A fifth current mirror has its input connected to the second current source and its output connected to the fourth current mirror and the second current mirror and thus generates a current proportional to Iee–Icc. Sixth and seventh current mirrors mirror this current and deliver it to the collectors of Q3 and Q4.

Although Iptat and Ibgap are used as current references in the examples described above, the current references are not so restricted. Any temperature-dependent current source may be used in place of Iptat, and any substantially temperature-independent current source may be used in place of Ibgap.

Additional stages may be connected to the collectors of Q3 and Q4, isolating the collectors from the output. For example, as shown in FIG. 2C, transistors Q5 and Q6 may be added in a cascode configuration with their bases connected to a voltage reference Vref, their emitters connected to the collectors of transistors Q3 and Q4, respectively, and their collectors connected to the resistors R at the amplifier output. It will be appreciated that the common base stage, although advantageous, is not necessary.

The configurations of current mirrors shown in FIGS. 2A–2C are only examples of how current injection may be implemented. Instead of the current mirrors shown current sources can be used.

Figure 3:
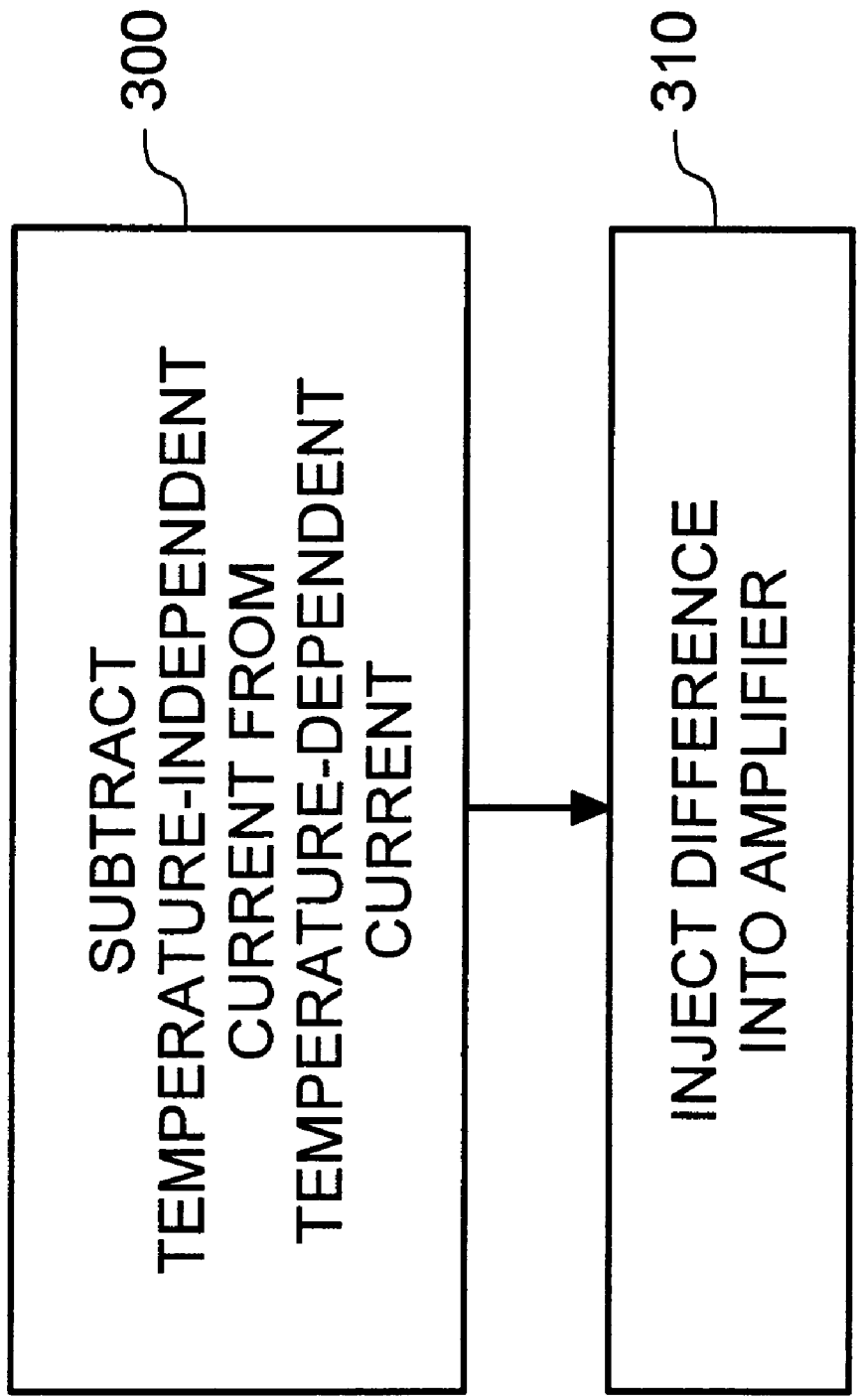
FIG. 3 illustrates a method for amplifier output biasing according to an exemplary embodiment.

FIG. 3 illustrates an exemplary method for amplifier biasing. The method begins at step 300 at which a temperature independent current is subtracted from a temperature dependent current. These currents may be generated separately or as part of the process of amplifier biasing. At step 310, the difference is injected at the amplifier output, thus providing the desired output bias current.

According to exemplary embodiments, a method and apparatus are provided for biasing an amplifier output to enhance performance characteristics. The method and apparatus described above may be used for, e.g., wide bandwidth amplifiers, e.g., a read amplifier operating in the 100 MHz–1 GHz range.

Although described in terms of amplifiers formed of one or more transistors, the invention is not so limited. It will be appreciated by those of ordinary skill in the art that this invention can be embodied in other specific forms without departing from its essential character. The embodiments described above should therefore be considered in all respects to be illustrative and not restrictive.

I claim:

1. An apparatus for biasing an amplifier output, comprising:

a subtraction circuit for subtracting a temperature-independent current from a temperature-dependent current to produce a difference current; and a current injection circuit for injecting the difference current at the output of the amplifier to bias the amplifier output and enhance performance characteristics.

2. The apparatus of claim 1, wherein the performance characteristics include gain and output voltage.

3. The apparatus of claim 1, wherein the amplifier is a differential amplifier.

4. The apparatus of claim 1, further comprising an additional amplifier stage for preventing the bandwidth performance of the amplifier from being affected by the current injection.

5. The apparatus of claim 1, wherein the temperature-independent current is generated by a band gap current reference.

6. The apparatus of claim 1, wherein the temperature-dependent current is generated by a proportional-to-absolute-temperature current reference.

7. The apparatus of claim 1, wherein the amplifier comprises a transistor, and the current is injected into a collector of the transistor.

8. The apparatus of claim 3, wherein the amplifier comprises two transistors, and the current is injected into the collectors of the transistors.

9. A method for biasing an amplifier output, comprising the steps of:

subtracting a temperature-independent current from a temperature-dependent current to produce a difference current; and injecting the difference current at the output of the amplifier to bias the amplifier output and enhance performance characteristics.

10. The method of claim 9, wherein the performance characteristics include gain and output voltage.

11. The method of claim 9, wherein the amplifier is a differential amplifier.

12. The method of claim 9, further comprising a step of processing the output of the amplifier through an additional amplifier stage for preventing the output bandwidth performance from being affected by the current injection.

13. The method of claim 9, wherein the temperature-independent current is generated by a bandgap current reference.

14. The method of claim 9, wherein the temperature-dependent current is generated by a proportional-to-absolute-temperature current reference.

15. The method of claim 9, wherein the amplifier comprises a transistor, and the step of injecting comprises injecting a current into a collector of the transistor.

16. The method of claim 11, wherein the amplifier comprises two transistors, and the step of injecting comprises injecting currents into the collectors of the transistors.

* * * * *